(12) United States Patent
Nishikawa et al.

(10) Patent No.: US 8,350,292 B2
(45) Date of Patent: Jan. 8, 2013

(54) GALLIUM NITRIDE EPITAXIAL CRYSTAL, METHOD FOR PRODUCTION THEREOF, AND FIELD EFFECT TRANSISTOR

(75) Inventors: Naohiro Nishikawa, Ichihara (JP); Hiroyuki Sazawa, Tsukuba (JP); Masahiko Hata, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 253 days.

(21) Appl. No.: 12/527,116

(22) PCT Filed: Feb. 7, 2008

(86) PCT No.: PCT/JP2008/052474
§ 371 (c)(1),
(2), (4) Date: Aug. 13, 2009

(87) PCT Pub. No.: WO2008/099901
PCT Pub. Date: Aug. 21, 2008

(65) Prior Publication Data
US 2010/0117094 A1    May 13, 2010

(30) Foreign Application Priority Data
Feb. 16, 2007  (JP) ................ 2007-036625

(51) Int. Cl.
*H01L 29/66* (2006.01)
(52) U.S. Cl. .......................... 257/192; 257/76
(58) Field of Classification Search .......... 257/76, 257/192, 615, E21.09, E21.091, E21.242, 257/94
See application file for complete search history.

(56) References Cited

U.S. PATENT DOCUMENTS
7,329,909 B2    2/2008  Saito et al.
2006/0170003 A1*  8/2006  Saito et al. ............ 257/189

FOREIGN PATENT DOCUMENTS
JP    10-312971 A    11/1998
JP    11-135770 A    5/1999
(Continued)

OTHER PUBLICATIONS
Machine Translation of Kazumasa JP 2004-363251.*
International Search Report dated May 13, 2008.
Examination Report dated Feb. 25, 2011 regarding UK Application No. GB0915202.6.
(Continued)

*Primary Examiner* — Julio J Maldonado
*Assistant Examiner* — Robert Bachner
(74) *Attorney, Agent, or Firm* — Fitch, Even, Tabin & Flannery, LLP

(57) ABSTRACT

The present invention provides a gallium nitride type epitaxial crystal, a method for producing the crystal, and a field effect transistor using the crystal. The gallium nitride type epitaxial crystal comprises a base substrate and the following (a) to (e), wherein a connection layer comprising a gallium nitride type crystal is arranged in an opening of the non-gallium nitride type insulating layer to electrically connect the first buffer layer and the p-conductive type semiconductor crystal layer. (a) a gate layer, (b) a high purity first buffer layer containing a channel layer contacting an interface on the base substrate side of the gate layer, (c) a second buffer layer arranged on the base substrate side of the first buffer layer, (d) a non-gallium nitride type insulating layer arranged on the base substrate side of the second buffer layer, and having the opening at a part thereof, and (e) a p-conductive type semiconductor crystal layer arranged on the base substrate side of the insulating layer.

13 Claims, 3 Drawing Sheets

FOREIGN PATENT DOCUMENTS

| | | | |
|---|---|---|---|
| JP | 2001-168111 | A | 6/2001 |
| JP | 2004-014674 | A | 1/2004 |
| JP | 2004-342810 | A | 12/2004 |
| JP | 2004-363251 | * | 12/2004 |
| JP | 2004-363251 | A | 12/2004 |
| JP | 2006-148015 | A | 6/2006 |
| JP | 2006-216671 | A | 8/2006 |

OTHER PUBLICATIONS

First Office Action dated Jun. 12, 2010 corresponding (Chinese Application No. 200880004951.9) Chinese and English translation from the Republic of China Patent Office.

* cited by examiner

GALLIUM NITRIDE EPITAXIAL CRYSTAL, METHOD FOR PRODUCTION THEREOF, AND FIELD EFFECT TRANSISTOR

CROSS-REFERENCE TO RELATED APPLICATIONS

This is a U.S. National Phase of International Application PCT/JP2008/052474, filed Feb. 7, 2008, and claims the benefit of priority under 35 U.S.C. §119 based on Japanese Application No. 2007-036625, filed Feb. 16, 2007, the entire disclosures of which applications are hereby incorporated herein by reference.

TECHNICAL FIELD

The present invention relates to a gallium nitride type (hereinafter referred to as a "GaN type") epitaxial crystal for field effect transistor, a method for production thereof, and a field effect transistor using the crystal.

BACKGROUND ART

A gallium nitride based-field effect transistor is a device in which high voltage resistance is expected from a size of band gap of a material. Actually, however, the high voltage resistance as expected is not achieved. One of the reasons is a problem of hole-withdrawing. When high electric field is applied to a transistor to drive the transistor, running electrons collide with crystal lattices, and this collision causes the phenomenon of a so-called impact ionization in which electrons and holes are generated. Electrons generated by the phenomenon are rapidly absorbed in a drain electrode. However, holes merely move relatively slowly toward the lower part of a source electrode in the crystal layer, and as a result, the holes remain and accumulate in crystals. When retention and accumulation of holes are caused, electrochemical potential of an element active layer is decreased, and more electrons run in the element active layer. This tends to induce further impact ionization. As a result, positive feedback phenomenon occurs, and then, a device leads to breakdown later. For this reason, when high voltage is applied to a transistor, the voltage should be applied to an extent such that positive feedback phenomenon of current increase does not occur. Even though band gap is large, it is not easy to achieve high voltage resistance commensurate with this.

The technology that holes generated by impact ionization are withdrawn outside an element active layer to overcome the problem is disclosed in, for example, JP 2001-168111A and JP 2004-342810A. This conventional technology is that in a GaN-based field effect transistor, a p-conductive GaN type epitaxial crystal layer electrically grounded is arranged over the entire lower part of the element active layer. It is considered that this constitution enable to withdraw holes generated by the phenomenon such as impact ionization outside from an element active layer by arranging the p-conductive type semiconductor crystal layer electrically grounded over the entire lower part of the element active layer.

According to the above conventional technology, a certain hole-withdrawing effect can be expected, but the technology has the following problems. A p-conductive GaN type crystal layer is generally formed doping magnesium or the like in high concentration, and therefore it has poor crystalline quality. As a result, an element active layer epitaxially grown on the crystal takes over poor crystalline quality of the p-conductive type gallium nitride layer. Due to this, the element active layer has problems that mobility of the running electrons is low, the problem that leakage current from a gate is large, and the like. Thus, it is difficult to prepare a transistor having practically usable level.

Furthermore, generally when a p-conductive type gallium nitride layer is formed, it is difficult to correctly and reproducibly control carrier concentration and distribution in the crystal, due to instability of activation rate and diffusion of a p-conductive type dopant. For this reason, the transistor having the structure that a p-conductive type layer is arranged at the lower part of a gate has another problem that fluctuation of threshold voltage and defective pinch-off often occur.

DISCLOSURE OF THE INVENTION

An object of the present invention is to provide a gallium nitride type epitaxial crystal that can overcome the above-mentioned problems in the prior art, and a method for producing the crystal. Another object of the present invention is to provide a field effect transistor having high voltage resistance.

As a result of earnest investigations, the present inventors have completed the present invention.

That is, the present invention provides the following (1) to (12).
(1) A gallium nitride type epitaxial crystal for field effect transistor, comprising:
  a base substrate,
  (a) a gate layer,
  (b) a high purity first buffer layer containing a channel layer being in contact with an interface on the base substrate side of the gate layer,
  (c) a second buffer layer arranged on the base substrate side of the first buffer layer,
  (d) a non-gallium nitride type insulating layer arranged on the base substrate side of the second buffer layer, and having an opening at a part thereof, and
  (e) a p-conductive type semiconductor crystal layer arranged on the base substrate side of the insulating layer,
  wherein a connection layer comprising a gallium nitride type crystal is arranged in the opening of the non-gallium nitride type insulating layer to electrically connect the first buffer layer and the p-conductive type semiconductor crystal layer.
(2) The crystal described in (1), wherein the connection layer is a p-conductive type crystal.
(3) The crystal described in (1) or (2), wherein the connection layer has an end extending toward the first buffer layer, and the end does not extend beyond the first buffer layer.
(4) The crystal described in any one of (1) to (3), wherein the connection layer is a crystal layer grown by selective growth on the p-conductive type semiconductor crystal layer exposed at the opening of the non-gallium nitride type insulating layer.
(5) The crystal described in any one of (1) to (4), wherein the first buffer layer has an average dislocation density of $1 \times 10^5/$cm or less, except for the upper part of the opening of the non-gallium nitride type insulating layer.
(6) The crystal described in any one of (1) to (5), wherein at least a part of the second buffer layer is a crystal layer formed by a selective lateral growth method using the gallium nitride type crystal provided in the opening as a base point.
(7) The crystal described in any one of (1) to (6), wherein the insulating layer comprises silicone oxide or silicon nitride.
(8) A field effect transistor formed using the crystal described in any one of (1) to (7), comprising:
  a gate electrode arranged on an upper part of the gate layer, and a source electrode and a drain electrode, arranged on both sides of the gate electrode and the gate layer connected to the gate by ohmic connection, wherein the opening or the connection layer formed in the opening is arranged so as to face the lower part of the source electrode, or the region between the source side edge of the gate electrode and the source electrode, and the p-conductive type semiconductor crystal layer is connected to a hole-withdrawing electrode.

(9) The field effect transistor described in (8), wherein the second buffer layer is a crystal layer grown by a lateral growth method.

(10) The field effect transistor described in (8), wherein the interface between the first buffer layer and the gate layer is constituted of a semiconductor heterojunction interface.

(11) A method for producing a gallium nitride type epitaxial crystal, comprising:

(i) a step of epitaxial growth of a p-conductive type semiconductor crystal layer onto a base substrate;

(ii) a step of formation of an insulating layer on the p-conductive type semiconductor crystal layer;

(iii) a step of formation of an opening in the insulating layer; and (iv) a step of growth of a connection layer for electrically connecting the p-conductive type semiconductor crystal layer and a first buffer layer, in the opening using the insulating layer as a mask.

(12) The method described in (11), further comprising:

(v) a step of growth of a crystal layer by a selective lateral growth method using the gallium nitride type crystal grown in the opening as a base point on the insulating layer after growth of the connection layer.

According to the present invention, the p-conductive type crystal layer for hole-withdrawing is counter-arranged on the lower layer of the source electrode in which holes accumulate and remain. This arrangement attempts to increase voltage resistance of a transistor. Additionally, an insulating layer is arranged at the lower part of the buffer layer lying from the gate electrode greatly affecting running characteristics of electrons to the drain electrode, and this arrangement can effectively prevent fluctuation of threshold value of a transistor and deterioration of pinch-off characteristic. Furthermore, a crystal layer having less dislocation defect grown by a lateral growth method is arranged on the upper layer (the opposite side of the substrate) of the insulating layer, and a buffer layer is formed by the crystal layer having excellent crystalline quality. This formation can further improve mobility of electrons and additionally can reduce leakage of gate current.

Figure 1:
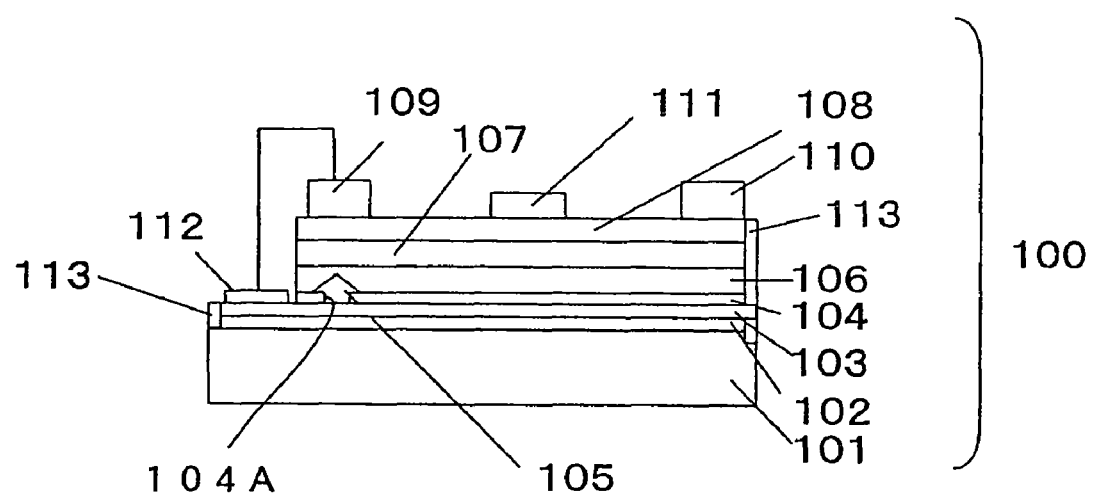
FIG. 1 is a schematic sectional view of GaN-based FET for explaining an embodiment of the present invention.

DESCRIPTION OF THE REFERENCE NUMERALS AND SIGNS 101 base substrate
102 buffer layer
103 p-conductive type semiconductor crystal layer
104 insulating layer
104A opening
105 connection layer
106 second buffer layer
107 first buffer layer
108 gate layer
109, 209 source electrode
110, 210 drain electrode
111, 211 gate electrode
112, 212 hole-withdrawing electrode
113, 213 element isolation groove
201 silicon carbide base substrate
202 aluminum nitride buffer layer
203 p-conductive type gallium nitride crystal layer
204 silicon nitride insulating layer
204a opening
205 p-conductive type gallium nitride connection layer
206 i-conductive type gallium nitride lateral growth layer
207 i-conductive type gallium nitride channel layer
208 i-conductive type aluminum gallium nitride electron donating layer

BEST MODE FOR CARRYING OUT THE INVENTION

The gallium nitride type epitaxial crystal of the present invention comprises a base substrate and the above-described (a) to (e). In the present invention, the connection layer comprising gallium nitride type crystal is arranged in the opening of the non-gallium nitride type insulating layer, and electrically connects the first buffer layer and the p-conductive type semiconductor crystal layer.

The present invention is described below by referring to the drawings.

FIG. 1 is a schematic sectional view of a gallium nitride-based field effect transistor (hereinafter referred to as "GaN-based FET") which applies the gallium nitride type epitaxial crystal of the present invention. A gallium nitride-based field effect transistor 100 comprises a base substrate 101, a buffer layer 102, a p-conductive type semiconductor crystal layer 103, an insulating layer 104, a buffer layer 106, a buffer layer 107, a gate layer 108, a connection layer 105, and electrodes 109, 110, 111 and 112.

Base Substrate

The base substrate 101 is a monocrystalline substrate comprising silicon carbide, sapphire, silicon, gallium nitride, gallium arsenide and the like. The base substrate 101 is generally semi-insulating, and low resistance p-conductive or n-conductive. It is preferably semi-insulating and low resistance p-conductive. Base substrates having various sizes are commercially available. Such commercially available products can be used for the base substrate 101.

Buffer Layer

The buffer layer 102 is grown on the base substrate 101. The buffer layer 102 is introduced for the purpose of alleviating distortion caused due to difference in lattice constant between the base substrate 101 and various semiconductor crystal layers grown on the base substrate 101 and preventing influence of impurities contained in the base substrate 101.

The buffer layer 102 comprises a material such as aluminum nitride, aluminum gallium nitride or gallium nitride. The buffer layer 102 can be formed by laminating the material on the base substrate 101 by MOVPE method, MBE method, HVPE method or the like. The buffer layer 102 can be grown by using the commercially available raw material suitable for each growth method. The buffer layer 102 has a thickness of generally 300 nm to 3,000 nm.

p-Conductive Type Semiconductor Crystal Layer

The p-conductive type semiconductor crystal layer 103 is grown on the buffer layer 102. The p-conductive type semiconductor crystal layer 103 comprises a material such as aluminum nitride, aluminum gallium nitride or gallium nitride. The p-conductive type semiconductor crystal layer 103 can be grown by MOVPE method, MBE method or HVPE method. The raw material uses the commercially available raw material suitable for each growth method. In the growth, impurities are doped in semiconductor crystal to obtain p-conductive form. Magnesium is used as a dopant. The doping concentration is generally from $5 \times 10^{16}$ $cm^{-2}$ to $1 \times 10^{21}$ $cm^{-2}$, more preferably from $1 \times 10^{17}$ $cm^{-2}$ to $1 \times 10^{20}$ $cm^{-2}$, and most preferably from $5 \times 10^{17}$ $cm^{-2}$ to $5 \times 10^{19}$ $cm^{-2}$. The p-conductive type semiconductor crystal layer 103 has a thickness of generally from 10 nm to 2,000 nm, more preferably from 50 nm to 1,500 nm, and most preferably from 100 nm to 1,000 nm.

Insulating Layer

The insulating layer 104 is grown on the p-conductive type semiconductor crystal layer 103. The insulating layer 104 comprises an electrically insulating material. The insulating layer 104 has a window, that is, an opening 104A. The p-conductive type semiconductor crystal layer 103 and an upper part of the insulating layer 104 are electrically connected by the opening 104A. The insulating layer 104 has a thickness of generally from 10 nm to 3,000 nm.

A connection layer shown by the reference numeral 105 is arranged in the opening 104A for electrical connection. The connection layer is described in detail hereinafter. The opening 104A has a width of generally from 100 nm to 5,000 nm, taking into consideration ease of processing and size of a transistor.

The insulating layer 104 comprises an electrically insulating material as described before, and generally has electrically sufficient insulating properties to impart sufficient pinch-off characteristic and stable threshold characteristics to a transistor. Furthermore, because epitaxial growth is conducted to the opening 104A provided in the insulating layer 104 for the growth of the connection layer 105 after the growth of the insulating layer 104, the insulating layer 104 has heat resistance durable to the growth temperature. Additionally, because the connection layer 105 is selectively grown on the p-conductive type semiconductor crystal layer 103, the insulating layer 104 comprises a material in which gallium nitride type crystal is not precipitated on the surface. Examples of the material include silicon nitride and silicon oxide. The insulating layer 104 is grown by vapor deposition method, sputtering method or CVD method. The commercially available material suitable for each growth method is used for the formation of the insulating layer 104.

Buffer Layer

A crystal layer having less dislocation is arranged on the insulating layer 104 such that holes on the upper layer side (element active layer side) of the insulating layer 104 can be withdrawn to the lower layer side (substrate side) of the insulating layer 104 with good efficiency through the connection layer 105. A second buffer layer 106 formed by epitaxial growth by lateral growth method is arranged on the insulating layer 104. The second buffer layer 106 comprises a material such as i-type or p-type aluminum gallium nitride, gallium nitride, or indium aluminum gallium nitride. The growth of the second insulating layer 106 is conducted by, for example, MOVPE method, MBE method or HVPE method, and preferably MOVPE method from the standpoint of ease of lateral growth. To obtain an i-type conductive layer, high purity is achieved or compensation element such as carbon, iron, manganese or chromium is added. To obtain a p-type conductive form, impurities are doped. Magnesium is used as a dopant. The second buffer layer 106 has a film thickness of generally from 500 nm to 5,000 nm, preferably from 700 nm to 4,000 nm, and more preferably from 900 nm to 3,000 nm. In either case of p-type or i-type, the second buffer layer 106 is preferably depleted. For the lateral growth of the second buffer layer 106, the connection layer 105 described hereinafter is used as a substrate (base point). As the connection layer 105 is preferred as a substrate of lateral growth of the second buffer layer 106, it is important that the sectional shape of the site upper than the insulating layer 104 forms facet surface as shown in FIG. 1. The lateral growth is a method of epitaxially growing crystals on the facet surface formed as a base in a direction parallel to the substrate. The method is described in, for example, JP 10-312971A and JP 11-135770A. Conditions are set by reference to those disclosures. The growth is conducted by appropriately selecting substrate temperature and reactor pressure. Conditions of the growth greatly depend on a shape of the reactor. The substrate temperature is generally from 1,050° C. to 1,250° C., preferably from 1,100° C. to 1,225° C., and more preferably from 1,150° C. to 1,200° C. The reactor pressure is generally from 0.5 ton to 200 torr, preferably from 1 torr to 100 torr, and more preferably from 5 torr to 50 torr.

A first buffer layer 107 having high purity is grown on the second buffer layer 106. The first buffer layer 107 includes a channel layer described hereinafter. The first buffer layer 107 comprises a material such as i-type or p-type aluminum gallium nitride, gallium nitride or indium aluminum gallium nitride. The material is appropriately be selected from the materials wherein large difference in lattice constant is not generated between the material and the second buffer layer 106 as a ground. The material preferably has the same crystal system and the same composition, as the second buffer layer 106. The growth of the first buffer layer 107 is conducted by, for example, MOVPE method, MBE method or HVPE method. The first buffer layer 107 has a film thickness of generally from 50 nm to 3,000 nm, preferably from 70 nm to 1,000 nm, and more preferably from 90 nm to 500 nm.

Gate Layer

The gate layer 108 is grown on the first buffer layer 107. The gate layer 108 comprises a material such as i-type or n-type aluminum gallium nitride, aluminum nitride or indium aluminum gallium nitride. It is important for the gate layer 108 to have a composition such that electron affinity is smaller than that of the first buffer layer 107. The thickness of the gate layer 108 is set within elastic strain limit due to the difference in lattice constant between the first buffer layer 107 and the gate layer, and is determined according to the composition set. The thickness is generally from 5 nm to 50 nm.

Channel Layer

The channel layer is grown at the first buffer layer 107 side of the interface between the first buffer layer 107 and the gate layer 108. Specifically, the first buffer layer 107 is a high purity layer containing the channel layer contacting the interface on the base substrate side of the gate layer 108. Difference in lattice constant is caused between the first buffer layer 107 and the gate layer by selecting the composition of the gate layer 108. The difference in lattice constant leads to generation of piezoelectric field, thereby inducing free carrier on the first buffer layer 107 side.

Connection Layer

The connection layer 105 is arranged in the opening 104A. FIG. 1 shows one embodiment of the connection layer 105 arranged in the opening 104A, and the embodiment of the arranged connection layer 105 is not limited to this embodiment. The end on the base substrate 101 side of the connection layer 105 is electrically connected to the p-conductive type semiconductor crystal layer 103. The end at the opposite side (upper layer side) of the connection layer 105 is extended toward the first buffer layer 107, but is not extended beyond the first buffer layer 107. Holes generated in the first buffer layer 107 can be flown into the p-conductive type semiconductor crystal layer 103 through the connection layer 105. The holes are finally withdrawn through a hole-withdrawing electrode 112 connected to the p-conductive type semiconductor crystal layer 103. The connection layer 105 generally comprises a material such as aluminum nitride, aluminum gallium nitride or gallium nitride. The connection layer 105 desirably has the same crystal system as the p-conductive type semiconductor crystal layer 103 and comprises a material having the same composition as the p-conductive type semiconductor crystal layer 103, such that potential barrier is not built against the holes generated in the first buffer layer 107. The conductive form of the connection layer 105 may be either of i-type, p-type or n-type. In any case, the electron concentration is set lower than that of the first buffer layer 107 such that barrier of potential is not generated to the holes generated in the first buffer layer 107. The thickness of the connection layer 105 is set within a range larger than that of the insulating layer 104. The thickness is generally from 20 nm to 10,000 nm, preferably from 50 nm to 5,000 nm, and more preferably from 100 nm to 2,000 nm.

Electrodes

A source electrode 109, a drain electrode 110 and a gate electrode 111 are formed on the gate layer 108. The source electrode 109 and the drain electrode 110 comprise a material such as Ti/Al. The gate electrode 111 comprises a material such as Ni/Au. The reference numeral 112 indicates a hole-withdrawing electrode. The hole-withdrawing electrode 112 is provided on an exposed part of the p-conductive type semiconductor crystal layer 103. The hole-withdrawing electrode 112 comprises a material such as Ni/Au. In FIG. 1, the source electrode 109 is connected to the hole electrode 112, and both electrodes are grounded. However, the hole-withdrawing electrode 112 may independently be biased negatively.

The reference numeral 113 indicates an element isolation groove for element isolation. To simplify the explanation, one field effect transistor 100 is shown in FIG. 1. However, the following embodiment may be employed. Many field effect transistors 100 are formed on an epitaxial crystal for the production of field effect transistor, and the element isolation groove 113 is provided. Thus, many field effect transistors 100 having the layer structure described above are formed so as not to electrically interfere mutually.

The arrangement relationship of the connection layer 105, the second buffer layer 106 and each electrode is described below. The arrangement constitution is desirably such that the connection layer 105 is arranged so as to face the region between the source side end of the gate electrode 111 and the source electrode 109 in the active region of a transistor, and other active region of a transistor faces the second buffer layer 106. In FIG. 1, the connection layer 105 as the p-conductive type crystal for hole-withdrawing is arranged on the lower layer of the source electrode 109 in which the holes accumulate and remain, so as to face the source electrode 109. By this constitution, holes can be drawn extremely effectively. This arrangement constitution effectively achieves withdrawing of holes from the first buffer layer 107 through the connection layer 105. Furthermore, due to the arrangement of the second buffer layer 106 formed by the lateral growth method, a crystal layer free of dislocation or having less dislocation is arranged as a crystal layer of a channel part of from the bottom of the gate electrode 111 in which carrier runs at the highest speed to the drain electrode 110. Therefore, a channel layer having higher mobility is formed, and mobility of electrons becoming carrier is further enhanced. This makes it possible to form a transistor having the characteristics such as high output and excellent frequency characteristics. The effect can be expected that increase in gate leakage current due to deterioration of lateral crystalline quality can be suppressed. Furthermore, the insulating layer 104 is arranged at the lower part of the first buffer layer 107 extending from the gate electrode 111 greatly affecting running characteristics of electrons to the drain electrode 110. This arrangement can effectively suppress leakage of current in a substrate direction and can effectively prevent fluctuation of threshold value of a transistor and deterioration of pinch-off characteristic.

The embodiment of heterojunction field effect transistor (HFET) is described, but the present invention can be applied to an epitaxial crystal substrate for MODFET and MESFET having other FET structure by changing the structure of the semiconductor crystal layer.

The present invention has been described above based on one embodiment, but the embodiment of the invention disclosed above is one exemplification, and the technical scope of the present invention is not limited to those embodiments. The technical scope of the present invention is indicated by the claims, and further encompasses the meaning equivalent to the claims and all of modifications within the scope.

EXAMPLES

The present invention is described in more detail by reference to the Examples, but the scope of the present invention is not limited to the Examples.

Figure 2:
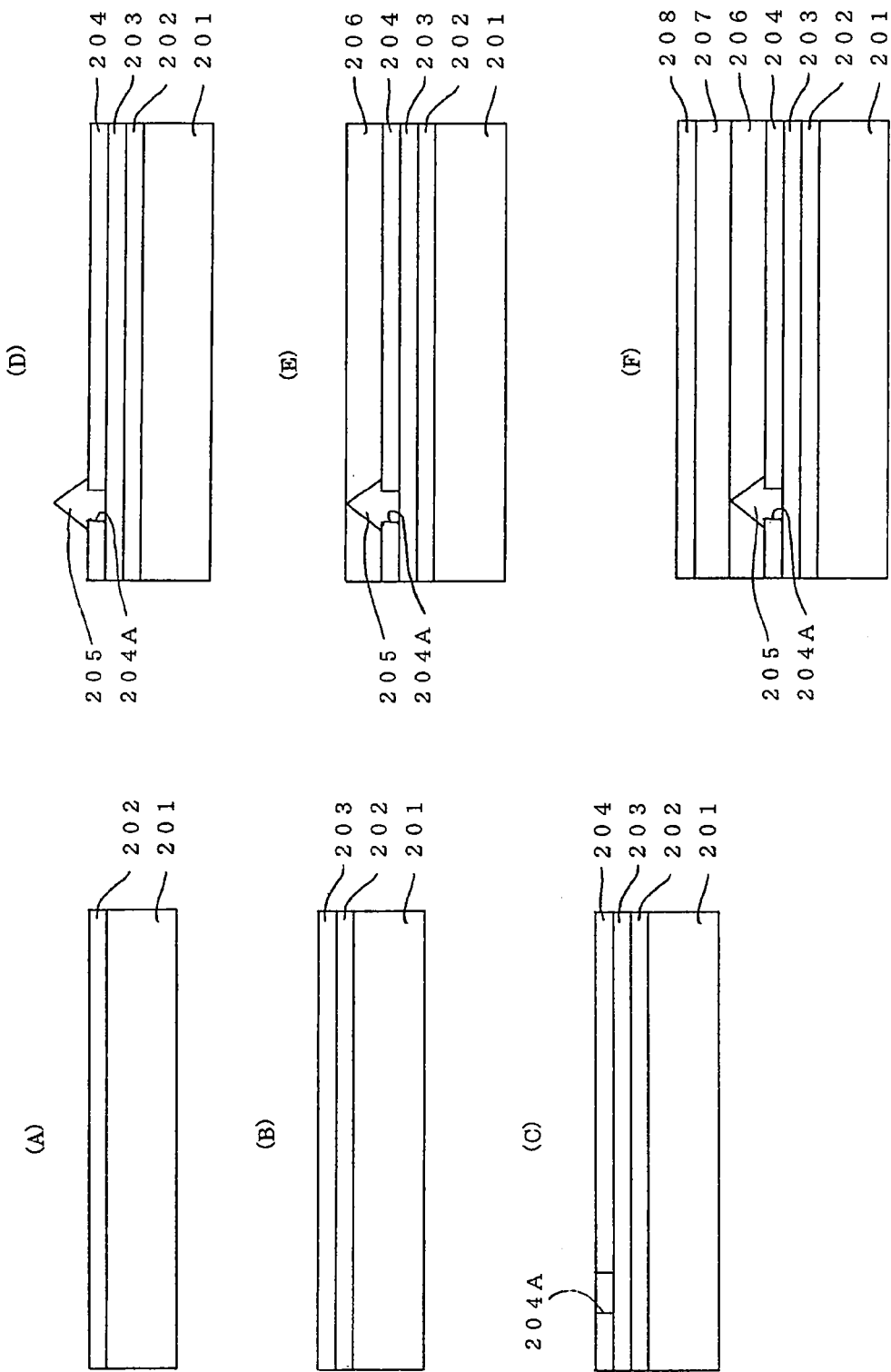
FIG. 2 is a view showing production steps of GaN-based FET for explaining an embodiment of the present invention.

FIG. 2 shows production steps of a gallium nitride-based field effect transistor having the constitution shown in FIG. 1.

[Preparation of Gallium Nitride Type Epitaxial Crystal]

A silicon carbide base substrate 201 having growth surface of (0001) and an off-angle of 0.5° was set in a growing reactor. An aluminum nitride buffer layer 202 having a thickness of 2,000 nm was grown on the base substrate 201 by MOCVD method (FIG. 2(A)).

A p-conductive type gallium nitride crystal layer 203 having magnesium doped therein, having a thickness of 500 nm and Mg concentration of $5 \times 10^{18}$ cm$^{-2}$ was grown by changing a raw material gas and using a magnesium raw material as a dopant (FIG. 2(B)).

After cooling, the base substrate 201 was taken out of the reactor. The base substrate 201 was set to a CVD apparatus, and a silicon nitride insulating layer 204 having a thickness of 500 nm was grown on the p-conductive type gallium nitride crystal layer 203 to give a substrate. The substrate was taken out of the CDV apparatus, the substrate was spin-coated with a resist, and a window was formed in the resist by a photolithography method. The window is used to form an opening 204A in the silicon nitride insulating layer 204. The window was formed linearly with a width of 1,000 nm parallel to a crystal face (11-20) of the p-conductive type gallium nitride crystal layer 203. Portion other than the window was formed with a width of 20,000 nm. The silicon nitride exposed by the formation of the window was removed by etching with a hydrofluoric acid aqueous solution. Thus, the opening 204A was formed (FIG. 2(C)).

The substrate obtained was again set to the reactor, and a p-conductive type gallium nitride connection layer 205 was grown by MOCVD method. Thus, facet comprising (11-22) face was formed on an upper layer higher than the silicon nitride insulating layer 204.

Feed of the magnesium raw material as a dopant was stopped, the substrate temperature and the reactor pressure were set to 1150° C. and 100 torr, respectively, and crystal was laterally grown on the (11-22) face. Thus, an i-conductive type gallium nitride lateral growth layer 206 having a thickness of 1,000 nm was grown on the (11-22) face (FIG. 2 (E)).

Then, pressure of the reactor and growth temperature were changed, and an i-conductive type gallium nitride channel layer 207 having a thickness of 500 nm was grown. Starting material gas was changed, and an i-type aluminum gallium nitride electron donating layer 208 having an aluminum element of 20% and a thickness of 30 nm was grown (FIG. 2(G)). Thus, a gallium nitride type epitaxial crystal for field effect transistor, having the layer structure shown in FIG. 2 (F) was prepared.

[Preparation of GaN Type FET]

Figure 3:
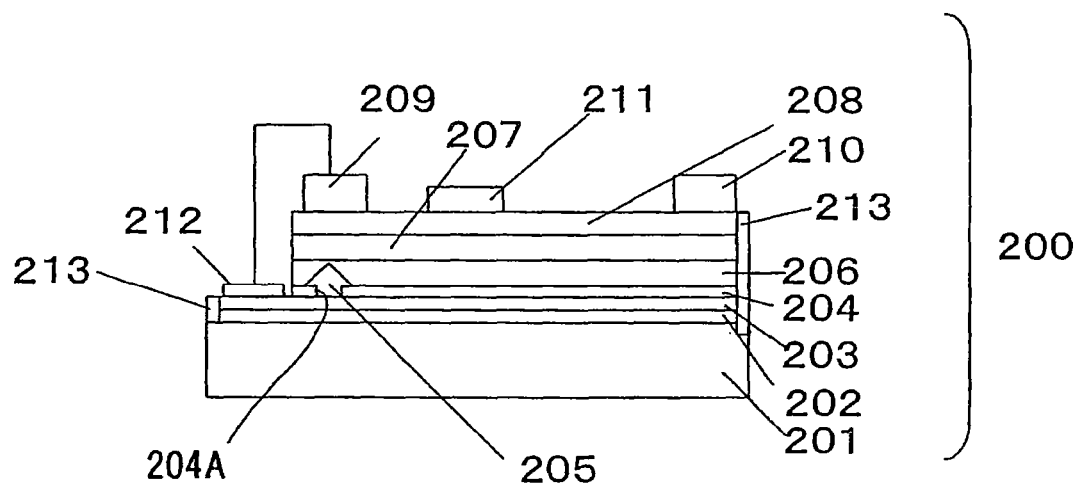
FIG. 3 is a schematic sectional view of GaN-based FET of the present invention.

A GaN type FET 200 shown in FIG. 3 was prepared using the gallium nitride type epitaxial crystal for field effect transistor in the following manner.

A given resist opening was formed by lithography method, and an element isolation groove 213 having a depth reaching the substrate was formed by ICP etching method using chlorine gas.

A hole-withdrawing electrode 212 was formed by etching a part of a crystal layer until reaching the p-conductive type gallium nitride crystal layer 203 in the same manner as above.

A resist opening having a given shape was formed by lithography method in the same manner as above. In this case, positioning was conducted such that the p-conductive type gallium nitride connection layer 205 is arranged at the lower part of the opening in which a source electrode 209 is formed in the subsequent step.

Ti/Al/Ni/Au metal film was formed by vapor deposition method in a thickness of 20 nm/150 nm/25 nm/50 nm, and then processed into a given shape by liftoff method.

The film was heated at 800° C. for 30 seconds in nitrogen atmosphere to form the source electrode 209 and a drain electrode 210.

Given resist opening was formed by the same lithography method, Ni/Au metal film was formed in a thickness of 25 nm/150 nm by vapor deposition method, and the metal film was processed into a given shape by liftoff method.

The metal film was heated at 700° C. for 30 seconds in nitrogen atmosphere to form a hole-withdrawing electrode 212.

Given resist opening was formed by the same lithography method, Ni/Au metal film was formed in a thickness of 25 nm/150 nm by vapor deposition method, and the metal film was processed into a given shape by liftoff method to form a gate electrode 211. Thus, GaN-based FET 200 having the structure shown in FIG. 3 was obtained.

The GaN-based FET has a distance between the source electrode 209 and the gate electrode 211 of 2 μm, a distance between the gate electrode 211 and the drain electrode 210 of 4 μm, a gate length of 1.5 μm and a gate width of 30 μm.

[Evaluation of GaN-Based FET]

Off-state breakdown voltage of the GaN-based FET was evaluated. The source electrode was grounded, −10V which is a voltage lower than a threshold voltage (−5.5V in the device prepared) was applied to the gate electrode, and drain voltage was applied in positive direction. Voltage when current value is 1 mA/mm was defined as breakdown voltage of an element. The breakdown voltage was 440V. Furthermore, 0V as applied as a gate voltage, 30V was applied as a drain voltage, and current density was measured. The current density was 921 mA/mm.

INDUSTRIAL APPLICABILITY

According to the present invention, high performance field effect transistor having high breakdown voltage, high electron mobility and low gate leakage current is provided. Furthermore, according to the present invention, a transistor having threshold securely controlled is produced with good reproducibility.

The invention claimed is:

1. A gallium nitride type epitaxial crystal for field effect transistor, comprising:
    a base substrate,
    (a) a gate layer,
    (b) a high purity first buffer layer containing a channel layer contacting an interface on the base substrate side of the gate layer,
    (c) a second buffer layer arranged on the base substrate side of the first buffer layer,
    (d) a non-gallium nitride type insulating layer arranged on the base substrate side of the second buffer layer, and having an opening at a part thereof, and
    (e) a p-conductive type semiconductor crystal layer arranged on the base substrate side of the insulating layer and connected to a hole-withdrawing electrode that is provided at an exposed part of the p-conductive type semiconductor crystal layer,
    wherein a connection layer is arranged in the opening of the non-gallium nitride type insulating layer to electrically connect the first buffer layer and the p-conductive type semiconductor crystal layer, and wherein said connection layer is a p-conductive type crystal comprising a group III-V type crystal.

2. The crystal of claim 1, wherein the connection layer has an end extending toward the first buffer layer, and the end does not extend beyond the first buffer layer.

3. The crystal of claim 1, wherein the connection layer is a crystal layer grown by selective growth on the p-conductive type semiconductor crystal layer exposed at the opening of the non-gallium nitride type insulating layer.

4. The crystal of claim 1, wherein the first buffer layer has an average dislocation density of $1 \times 10^5$/cm or less, except for the upper part of the opening of the non-gallium nitride type insulating layer.

5. The crystal of claim 1, wherein at least a part of the second buffer layer is a crystal layer formed by a selective lateral growth method using the gallium nitride type crystal provided in the opening as a base point.

6. The crystal of claim 1, wherein the insulating layer comprises silicone oxide or silicon nitride.

7. A field effect transistor formed using the crystal of claim 1, comprising:
    a gate electrode arranged on an upper part of a gate layer, and a source electrode and a drain electrode, arranged on both sides of the gate electrode and connected to the gate layer by ohmic connection, wherein the opening or the connection layer formed in the opening is arranged so as to face the lower part of the source electrode, or the region between the source side edge of the gate electrode and the source electrode.

8. The field effect transistor of claim 7, wherein the second buffer layer is a crystal layer grown by a lateral growth method.

9. The field effect transistor of claim 7, wherein the interface between the first buffer layer and the gate layer is constituted of a semiconductor heterojunction interface.

10. The gallium nitride type epitaxial crystal according to claim 1, wherein said connection layer is thicker than said first buffer layer.

11. The gallium nitride type epitaxial crystal according to claim 1, wherein said connection layer is a p-conductive type crystal comprising gallium nitride.

12. The gallium nitride type epitaxial crystal according to claim 1, wherein said p-conductive type semiconductor crystal layer comprises a group III-V type crystal.

13. The gallium nitride type epitaxial crystal according to claim 1, wherein said connection layer and said p-conductive type semiconductor crystal layer have the same crystal system.

* * * * *